United States Patent
Son et al.

[19]

[11] Patent Number: 6,049,245
[45] Date of Patent: Apr. 11, 2000

[54] POWER REDUCTION CIRCUIT

[75] Inventors: Joo-Hiuk Son; Hae-Young Rah, both of Chungcheongbuk-do, Rep. of Korea

[73] Assignee: LG Semicon Co., Ltd., Cheongju, Rep. of Korea

[21] Appl. No.: 09/154,172

[22] Filed: Sep. 16, 1998

[30] Foreign Application Priority Data

Nov. 27, 1997 [KR] Rep. of Korea .................. 97-63285

[51] Int. Cl.$^7$ ...................................................... G05F 1/10
[52] U.S. Cl. ............................. 327/544; 327/374; 326/17
[58] Field of Search ................................... 327/544, 124, 327/374; 326/17, 82, 83

[56] References Cited

U.S. PATENT DOCUMENTS

| | | | |
|---|---|---|---|
| 5,274,601 | 12/1993 | Kawahara et al. | 365/230.06 |
| 5,583,457 | 12/1996 | Horiguchi et al. | 326/121 |
| 5,614,847 | 3/1997 | Kawahara et al. | 326/98 |
| 5,781,062 | 7/1998 | Mashiko et al. | 327/544 |
| 5,821,769 | 10/1998 | Douseki | 326/34 |
| 5,828,235 | 10/1998 | Horiguchi et al. | 326/121 |

Primary Examiner—Kenneth B. Wells
Assistant Examiner—Hai L. Nguyen
Attorney, Agent, or Firm—Fleshner & Kim

[57] ABSTRACT

A power reduction circuit is provided that includes a first switching device between a first operating voltage terminal and a second operating voltage terminal being controlled by a first active signal. A second switching device is between a third operating voltage terminal and a fourth operating voltage terminal is controlled by the inverse active signal. A signal transfer gate logic coupled between the second and the fourth operating voltage terminals to selectively output one of the second and the fourth operating voltages. A first voltage drop device is between the first and the second operating voltage terminals and is selectively activated by a first control device according to one of a first and a second operating modes. A second voltage drop device is between the third and the fourth operating voltage terminals and is selectively activated by a second control device according to one of the first and the second operating modes. The first and second voltage drop devices have predetermined turn-on resistances. The power reduction circuit provides for each mode and a high-speed operation for switching from the standby mode to the active mode.

17 Claims, 4 Drawing Sheets

POWER REDUCTION CIRCUIT

BACKGROUND OF THE INVENTION

1. Field of the Invention

The present invention relates to a semiconductor integrated circuit, and in particular, to a power reduction circuit in a semiconductor integrated circuit.

2. Background of the Related Art

In a semiconductor integrated circuit, unnecessary power consumption can be reduced by controlling the value of a supply voltage according to a power consumption adjustment from an external source or a control signal thereof. For example, when the control signal of the power consumption adjustment is not externally supplied during a predetermined time period, the power reduction circuit converts the semiconductor integrated circuit to a standby mode and reduces the supply voltage. In the standby mode, upon detecting the control signal for the power consumption adjustment, the power reduction circuit again applies the supply voltage at the original level to operate the semiconductor integrated circuit normally.

A related art power reduction circuit is shown in FIG. 1. As shown in FIG. 1, resistors R1 and R2 are connected to the terminals of power supplies VDD and VSS, respectively. Local power supplies VDD_L and VSS_L are generated through the resistors R1 and R2, respectively.

Switching devices Q1 and Q4 are connected in parallel to the resistors R1 and R2, respectively. The PMOS transistor Q1 is controlled by the inverted active signal/ACT. When the inverted active signal/ACT is at a low level, Q1 is turned on and short-circuits the VDD terminal and VDD_L terminal. The NMOS transistor Q4 is controlled by the active signal ACT. When the active signal ACT is at a high level, Q4 is turned on and short-circuits the VSS terminal and VSS_L terminal.

A CMOS inverter is inserted between terminals of VDD_L and VSS_L, which is composed of the PMOS transistor Q2 and the NMOS transistor Q3. Each of the transistors Q2 and Q3 has a lower threshold voltage Vt than any other MOS transistor for realizing a high-speed operation.

FIG. 2. shows a power reduction circuit having MOS transistors instead of the voltage reduction device of FIG. 1. As a voltage reduction device, the NMOS transistor Q5 and PMOS transistor Q6 are connected to the terminals of VDD and VSS, respectively. Each transistor Q5 and Q6 operates as a resistor device by the short-circuit of its gate and source.

The power supply voltage VDD and the local power supply voltage VDD_L have a voltage difference as much as the threshold voltage Vtn of the NMOS transistor Q5.

In other words, VDD_L=VDD-Vtn is applied. The ground voltage VSS and the local ground voltage VSS_L have also a voltage difference as much as the threshold voltage Vtp of the PMOS transistor Q6. That is, VSS_L=VSS+Vtp is applied.

In the active mode, when the active signal ACT is at a high level and the inverted active signal/ACT is at a low level, The transistor Q1 is turned on. At this time, VDD_L=VDD is applied, if a voltage drop due to Vtp of the transistor Q1 is not considered. The transistor Q4 is also turned on and VSS_L=VSS is applied if a voltage drop due to Vtn of the transistor Q4 is not considered. Therefore, when ACT is brought to a high level, the transistors Q5 and Q6 do not affect VDD_L and VSS_L. In this state, the CMOS inverter generates the output signal OUT of the level of VDD or VSS according to the logic value of the input signal IN.

In the standby mode, the signal ACT becomes a low level and/ACT a high level. These signals respectively turn off the transistors Q1 and Q4. The current path between terminals of VDD and VDD_L is made by The transistor Q5 and the current path between terminals of VSS and VSS_L by the transistor Q6. In the standby mode, the CMOS inverter generates the output signal OUT of the level of VDD_L or VSS_L according to the logic value of the input signal IN.

In the related art power reduction circuit, the threshold voltages Vtn and Vtp of the transistors Q5 and Q6 are determined based on an expected power reduction. If the power reduction is expected to be high, Vtn and Vtp of the transistors Q5 and Q6 should be raised to lower VDD_L. However, if Vtn and Vtp are large, the switching from the standby mode to the active mode takes longer.

As described above, the related art power reduction circuit has various disadvantages. If Vtn and Vtp are not small enough to be realized a resistor device, good power reduction will not result. If Vtn and Vtp are set large considering only the power reduction, the switching time from the standby mode to the active mode becomes too long, and it is difficult to perform a high-speed operation. Thus, the threshold voltage Vtn or Vtp can only be set to comply with one of a good power reduction and a good operation speed.

The above references are incorporated by reference herein where appropriate for appropriate teachings of additional or alternative details, features and/or technical background.

SUMMARY OF THE INVENTION

An object of the present invention is to substantially obviate at least the problems and disadvantages of the related art.

Another object of the present invention is to enable good power reduction and a high-speed operation.

In order to achieve at least the above objects in a whole or in parts, a power reduction circuit is provided according to the present invention that includes a first switching device that forms a first current path between a first operating voltage terminal and a second operating voltage terminal, wherein the first switching device is controlled by an active signal, a second switching device that forms a first current path between a third operating voltage terminal and a fourth operating voltage terminal, wherein the second switching device is controlled by an inverse active signal, a signal transfer gate logic that couples the second and the fourth operating voltage terminals to selectively output one of second and fourth operating voltages, first and second control devices, a first voltage drop device that forms a second current path between the first and the second operating voltage terminals, wherein the first voltage drop device is selectively activated by the first control device based on first and second operating modes, and wherein the first voltage drop device has a first prescribed turn-on resistance and a second voltage drop device that forms a second current path between the third and the fourth operating voltage terminals, wherein the second voltage drop device is selectively activated by the second control device based on the first and the second operating modes, and wherein the second voltage drop device has a second prescribed turn-on resistance.

To further achieve the above objects in a whole or in parts, a power reduction circuit is provided according to the present invention that includes a first switching device that couples a first operating voltage terminal and a second operating voltage terminal, wherein the first switching device is controlled by a first signal, a second switching device that couples a third operating voltage terminal and a fourth operating voltage terminal, wherein the second switching device is controlled by a second signal, a signal transfer gate logic that couples the second and the fourth operating voltage terminals to selectively output one of second and fourth operating voltages, a first voltage drop device that couples the first and the second operating voltage terminals, wherein the first voltage drop device is selectively activated based on first and second operating modes, and wherein the first voltage drop device has a first prescribed turn-on resistance and a second voltage drop device that couples the third and the fourth operating voltage terminals, wherein the second voltage drop device is selectively activated based on the first and the second operating modes, and wherein the second voltage drop device has a second prescribed turn-on resistance.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
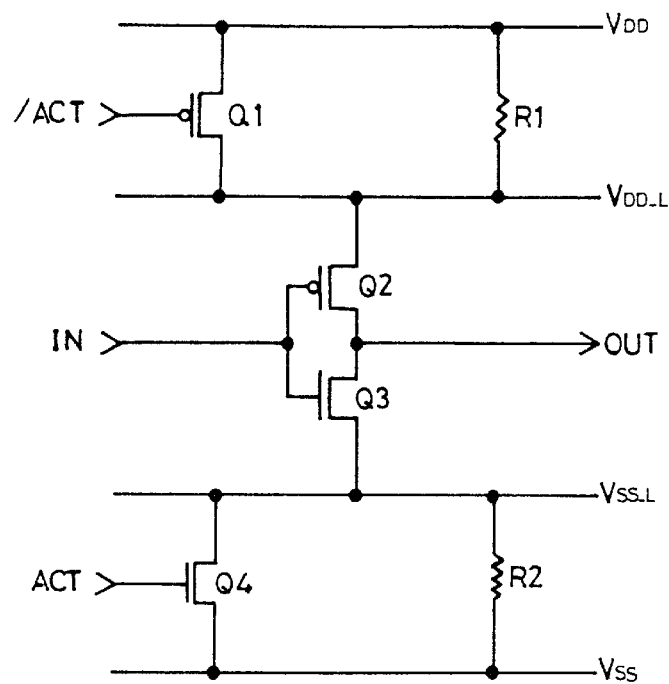
FIG. 1 is a circuit diagram showing a related art power reduction circuit.
Figure 2:
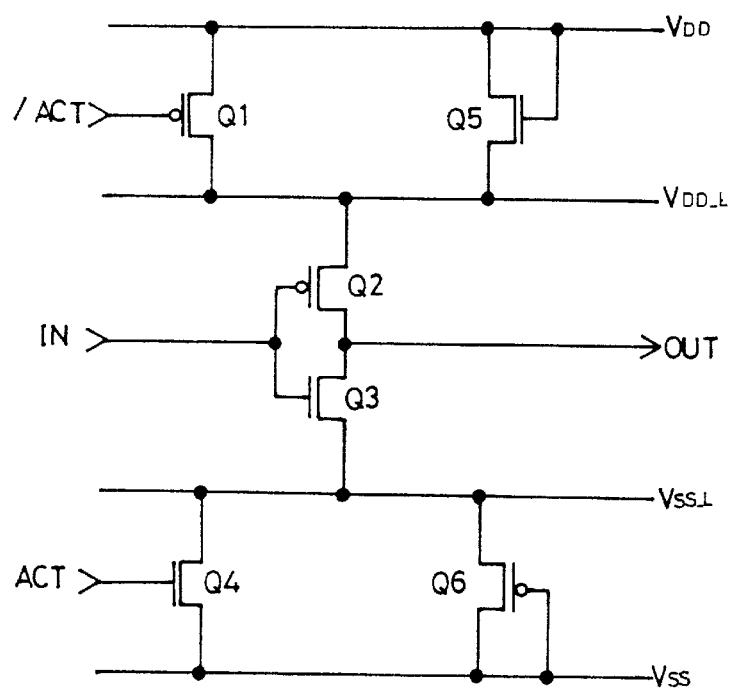
FIG. 2 is a diagram showing a related art power reduction circuit having a MOS transistor.
Figure 3:
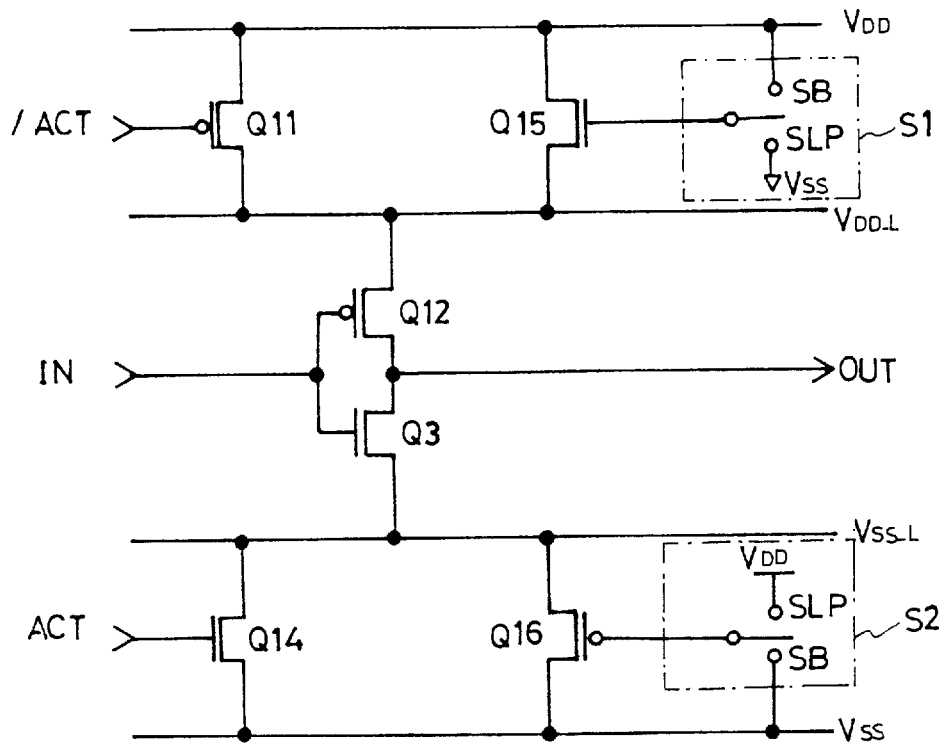
FIG. 3 is a diagram showing a preferred embodiment of a power reduction circuit according to the present invention.

FIG. 3 shows a preferred embodiment of a power reduction circuit according to the present invention. As shown in FIG. 3, a power supply voltage VDD terminal is coupled to the local power supply voltage VDD_L terminal through a first switching device, which is preferably PMOS transistor Q11. The gate of the transistor Q11 is controlled by an inverted active signal/ACT.

An active signal ACT is generated when a load operates normally. If the active signal ACT is at a high level, the inverted active signal/ACT becomes low level and the transistor Q11 is turned on. At this time, the VDD and the VDD_L terminals are short-circuited and the electric potential of the two terminals is equal. On the other hand, if the active signal ACT is at a low level, the inverted active signal/ACT becomes high level and the transistor Q11 is turned off, and the VDD and the VDD_L terminals are not short circuited.

A first voltage drop device including NMOS transistor Q15 and the PMOS transistor Q11 are inserted in parallel between the VDD and VDD_L terminals. The gate of Q15 is preferably controlled by the output signal of an operating mode control section S1 of a first control device. The operation mode control section S1 generates a high-level output signal based on VDD in a standby mode SBM and a low-level output signal based on VSS in a sleep mode SLPM to control the gate of the transistor Q15. Therefore, the transistor Q15 is turned on in the standby mode and turned off in the sleep mode. When the VDD and the VDD_L terminals are opened in the standby mode, the level of local power supply voltage VDD_L is determined according to the on/off state of the transistor Q15. The transistor Q15 has two control modes being the standby mode SBM and the sleep mode SLPM. In the SBM mode, the transistor Q15 is turned on and VDD_L=VDD-Vtn is applied. In the SLPM mode, the transistor Q15 is turned off and the VDD and the VDD_L terminals are opened. Since the transistor Q15 has a comparatively high threshold voltage to reduce a switching time from the standby mode to the active mode, the transistor Q15 is affected by a leakage current. However, a leakage current amount is much less than that of the current supplied when the transistor Q15 is turned on in the standby mode.

A second switching device is an NMOS transistor Q14, and a second voltage drop device includes a PMOS transistor Q16. The second switching device and the second voltage drop device are inserted in parallel between the ground voltage VSS and the local ground voltage VSS_L terminals. The gate of the transistor Q14 is controlled by the active signal ACT. When the active signal ACT is at a high level, the transistor Q14 is turned on. Therefore, the VSS and the VSS_L terminals are short-circuited and the electric potential of the terminals are equal. On the other hand, when the active signal ACT is at a low level in the standby mode, the transistor Q14 is turned off, and the VSS and the VSS_L terminals are not short circuited.

The gate of PMOS transistor Q16 is preferably controlled by the output signal of an operating mode control section S2 of a second control device. The operation mode control section S2 generates the low-level output signal based on VSS in the standby mode SBM and the high-level output signal based on VDD in the sleep mode SLPM to control the gate of the transistor Q16.

Therefore, the transistor Q16 is turned on in the SBM mode and turned off in the SLPM mode. When the VSS and the VSS_L terminals are opened in the standby mode SBM, the level of local ground voltage VSS_L is determined according to the on/off state of the transistor Q16. The transistor Q16 has two control modes being the SBM and the SLPM modes. In the SBM mode, the transistor Q16 is turned on, and VSS_L=VSS+Vtp is applied. In the SLPM mode, the transistor Q16 is turned off, and the VSS and the VSS_L terminals are opened. Therefore, no current flows between the VSS and the VSS_L terminals unless the leakage current of transistors Q14 and Q16 is considered.

A CMOS inverter is inserted between the VDD_L and the VSS_L terminals, which is preferably a signal transit gate logic. The CMOS inverter includes a serial coupled PMOS transistor Q12 and NMOS transistor Q13. Each gate of the transistors Q12 and Q13 is controlled by the input signal IN, and the CMOS inverter generates the output signal OUT. The voltage level of an output signal OUT is varied according to each mode, i.e. the active mode, the standby mode, the sleep mode. In the active mode, the output signal OUT is the normal VDD or VSS. In the standby mode, because of the transistors Q15 and Q16, the output signal OUT is VDD-Vtn at the high level and VSS+Vtp at the low level, respectively. In the sleep mode, VDD_L and VSS_L is in the high impedance state, and power consumption is almost nil.

Figure 4A:
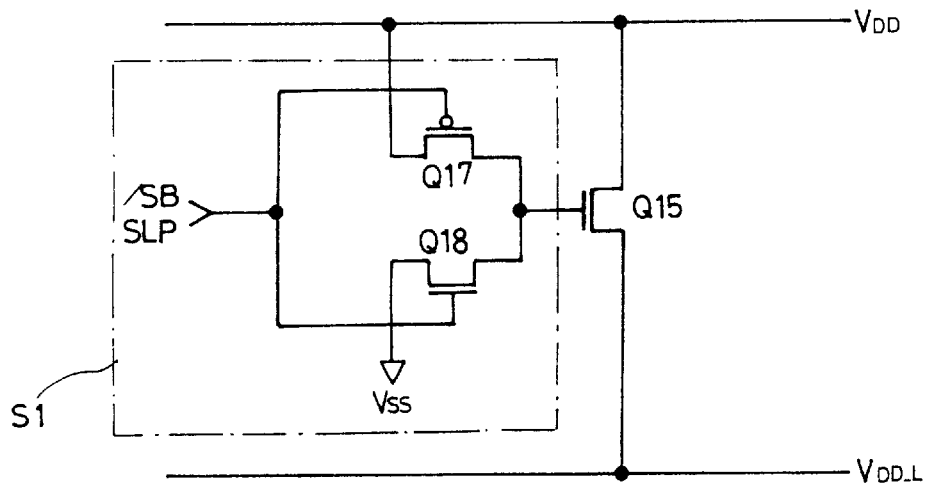
FIGS. 4A and 4B are circuit diagrams showing exemplary control units of the circuit of FIG. 3.

FIG. 4A is a circuit diagram showing the operating mode control sector S1 for on/off controlling the NMOS transistor Q15 according to the standby mode SBM and the sleep mode SLPM. Each drain of the PMOS transistor Q17 and the NMOS transistor Q18 is coupled to each other to form an output terminal. The source of the transistor Q17 is coupled to the VDD terminal and the source of the transistor Q18 to the VSS terminal. Each gate of the transistors Q17 and Q18 is preferably controlled by an inverted standby signal/SB or a sleep signal SLP. In this case, the two signals preferably have the same logic value.

When switched to the standby mode, the standby signal SB is high level. At this time, SLP is low level, the inverted standby signal/SB becomes low, and the transistor Q18 is turned off and the transistor Q17 is on. Therefore, the transistor Q15 is turned on by VDD having the high level.

In the sleep mode, the sleep signal SLP is high level. At this time, SB is low level, the transistor Q17 is turned off and the transistor Q18 is on. Therefore, the transistor Q15 is turned off by VSS having the low level.

Figure 4B:
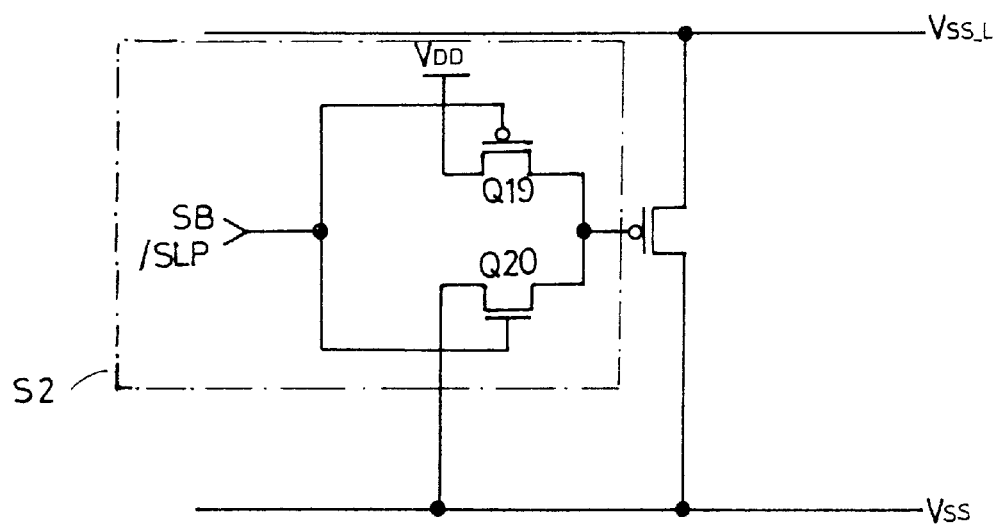

FIG. 4B is a circuit diagram showing the operating mode control sector S2 for on/off controlling the PMOS transistor Q16 according to the standby mode and the sleep mode. The drain of the PMOS transistor Q19 is coupled to the drain of the NMOS transistor Q20 to form an output terminal. The source of the transistor Q19 is coupled to the VDD terminal and the source of the transistor Q20 to the VSS terminal. Each gate of the transistors Q19 and Q20 is preferably controlled by the SB signal or the/SLP signal. In this case, the SB signal has the same logic value as the/SLP signal.

When switched to the standby mode, the SB signal is high level. At this time, SLP is low level, the transistor Q19 is turned off and the transistor Q20 is on. Therefore, the transistor Q16 is turned on by VSS having the low level.

In the sleep mode, the SLP signal is high level. At this time, SB is at a low level, the/SLP signal becomes low, and the transistor Q20 is turned off and the transistor Q19 is on. Therefore, the transistor Q16 is turned off by VDD having the high level.

As shown in FIG. 3, the voltage drop devices are the transistors Q15 and Q16. However, the voltage drop device of the first preferred embodiment is not intended to be limited to this. Any circuit generating a voltage drop that is controlled by the operating mode control section S1 and S2 to cause a predetermined voltage drop could be used. Thus, the voltage drop device could be composed by other than transistors Q15 and Q16.

Figure 5A:
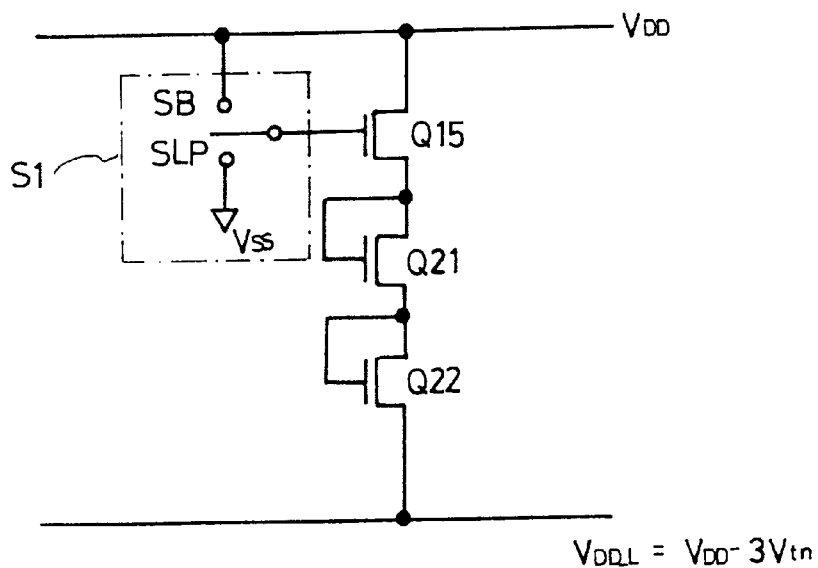
FIGS. 5A and 5B are circuit diagrams showing an exemplary voltage drop unit.
Figure 5B:
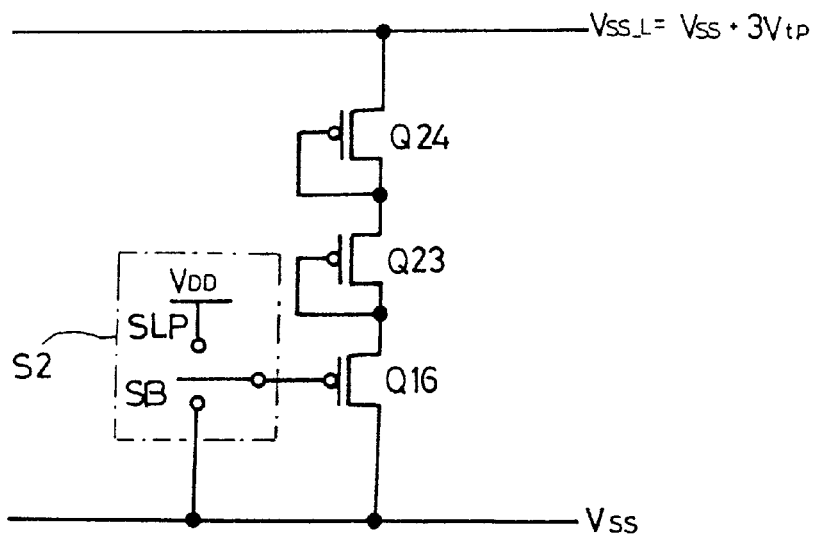

FIGS. 5A and 5B are circuit diagrams showing additional voltage drop devices of the power reduction circuit according to the preferred embodiment. FIG. 5A is a circuit diagram showing a third voltage drop generates the local power supply voltage VDD_L by voltage dropping the power supply voltage VDD. Three NMOS transistors Q15, Q21 and Q22 are coupled in series between the VDD and the VDD_L terminals. The gates and drains of the two transistors Q21 and Q22 are coupled to each other, respectively. The transistor Q15 is on/off controlled by the operating mode control section S1. When the transistor Q15 is turned on, VDD_L=VDD-3Vtn is applied. As described above, the specific value of VDD_L is determined according to a number of the NMOS transistors coupled in series.

FIG. 5B is a circuit showing a fourth voltage drop device that generates the local ground voltage VSS_L by voltage dropping (actually, voltage increasing) the ground voltage VSS. Three PMOS transistors Q16, Q23 and Q24 are coupled in series between the VSS and the VSS_L terminals. The gates and drains of the two transistors Q23 and Q24 are coupled to each other, respectively. The transistor Q16 is on/off controlled by the operating mode control section S2. When the transistor Q16 is turned on, VSS_L= VSS+3Vtp is applied. As described above, the value of VSS_L is determined according to the number of the PMOS transistors coupled in series.

Operations of the preferred embodiment of the power reduction circuit present invention will now be described. If an external control or a predetermined control signal is not generated for a prescribed time in the active mode (e.g., the active ACT signal is at a high level), the active signal ACT is brought to the low level, and the mode is switched to the standby or the sleep mode. The active mode is switched to the standby mode. Thus, the active mode is preferably not directly switched to the sleep mode. The standby mode is an operating mode when the external control or the control signal is not generated for a relatively short time. Therefore, in the standby mode, since there is every probability of switching to the active mode, the threshold voltage of the voltage drop device is relatively low and switching to the active mode can be rapidly performed. That is, an optimal or desired power reduction is not obtained, but high-speed operation remains possible. If the standby mode is maintained for a predetermined time, the operating mode is switched to the sleep mode because of the reduced or minimal probability of switching to the active mode. When switching to the sleep mode, the switching device and the voltage drop device are turned off. Therefore, even if switching to the active mode can take an increased or long tome period, the power reduction is optimally or desirably improved because the power consumption is very small.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A power reduction circuit, comprising:
   a first switching device that couples a first operating voltage terminal and a second operating voltage terminal, wherein the first switching device is controlled by a first signal;
   a second switching device that couples a third operating voltage terminal and a fourth operating voltage terminal, wherein the second switching device is controlled by a second signal;
   a signal transfer gate logic that couples the second and the fourth operating voltage terminals to selectively output one of second and fourth operating voltages;
   a first voltage drop device that couples the first and the second operating voltage terminals, wherein the first voltage drop device is selectively activated based on first and second operating modes, and wherein the first voltage drop device has a first prescribed turn-on resistance; and
   a second voltage drop device that couples the third and the fourth operating voltage terminals, wherein the second voltage drop device is selectively activated based on the first and the second operating modes, and wherein the second voltage drop device has a second prescribed turn-on resistance.

2. The power reduction circuit of claim 1, wherein the first switching device and the first voltage drop device form first and second current paths between the first and second operating voltage terminals, wherein the second switching device and the second voltage drop device form first and second current paths between the third and fourth operating voltage terminals, wherein the first signal is an active signal and the second signal is the inverse active signal.

3. The power reduction circuit of claim 1, further comprising a first control device that activates the first voltage drop device by supplying the first operating voltage in the first operating mode and deactivates the first voltage drop device by supplying the third operating voltage in the second operating mode.

4. The power reduction circuit of claim 1, further comprising a second control device that activates the second voltage drop device by applying the third operating voltage in the first operating mode and deactivates the second voltage drop device by applying the first operating voltage in the second operating mode.

5. A power reduction circuit, comprising:
   a first switching device that forms a first current path between a first operating voltage terminal and a second operating voltage terminal, wherein the first switching device is controlled by an active signal;
   a second switching device that forms a first current path between a third operating voltage terminal and a fourth operating voltage terminal, wherein the second switching device is controlled by an inverse active signal;
   a signal transfer gate logic that couples the second and the fourth operating voltage terminals to selectively output one of second and fourth operating voltages;
   first and second control devices;
   a first voltage drop device that forms a second current path between the first and the second operating voltage terminals, wherein the first voltage drop device is selectively activated by the first control device based on first and second operating modes, and wherein the first voltage drop device has a first prescribed turn-on resistance; and
   a second voltage drop device that forms a second current path between the third and the fourth operating voltage terminals, wherein the second voltage drop device is selectively activated by the second control device based on the first and the second operating modes, and wherein the second voltage drop device has a second prescribed turn-on resistance.

6. The power reduction circuit of claim 5, wherein the first control device activates the first voltage drop device by supplying the first operating voltage in the first operating mode and deactivates the first voltage drop device by supplying the third operating voltage in the second operating mode.

7. The power reduction circuit of claim 6, wherein the first voltage drop device is a first NMOS transistor, the first NMOS transistor having a drain and a source respectively coupled to the first and the second operating voltage terminals.

8. The power reduction circuit of claim 6, wherein the first voltage drop device comprises a plurality of NMOS transistors coupled between the first and the second operating voltages, wherein one of the plurality of NMOS transistors receives an output signal of the first control device through its control electrode and each remaining one of the plurality of NMOS transistors has its control electrode coupled to its first electrode.

9. The power reduction circuit of claim 6, wherein the first control device comprises:

a first transistor that receives the first operating voltage at a first electrode and has a second electrode coupled to the first voltage drop device; and
a second transistor having a first electrode coupled to the second operating voltage terminal, a second electrode coupled to the first voltage drop device and a control electrode coupled to a control electrode of the first transistor, and wherein a control signal of one of the first and second operating modes is applied to the control electrodes of the first and the second transistors.

10. The power reduction circuit of claim 6, wherein the second operating voltage is equal to the first operating voltage reduced by a threshold voltage of the first voltage drop device, when the first voltage drop device is activated.

11. The power reduction circuit of claim 5, wherein the first control device comprises:
   a PMOS transistor that outputs the first operating voltage to activate the first voltage drop device when enabled, wherein the PMOS transistor is enabled by a first operating mode control signal; and
   an NMOS transistor that outputs the third operating voltage to deactivate the first voltage drop device when enabled, wherein the NMOS transistor is enabled by the first operating mode control signal.

12. The power reduction circuit of claim 5, wherein the second control device activates the second voltage drop device by applying the third operating voltage in the first operating mode and deactivates the second voltage drop device by applying the first operating voltage in the second operating mode.

13. The power reduction circuit of claim 12, wherein the second voltage drop device is a first transistor, wherein first and second electrodes of the first transistor are respectively coupled to the third and the fourth operating voltage terminals.

14. The power reduction circuit of claim 13, wherein the second control device comprises:
   a second transistor that receives the first operating voltage through a first electrode and has a second electrode coupled to the control electrode of the first transistor; and
   a third transistor that receives the third operating voltage through a first electrode and has a second electrode coupled to the control electrode of the first transistor, and wherein a control signal of one of the first and the second operating modes is applied to the control electrodes of the second and the third transistors.

15. The power reduction circuit of claim 12, wherein the second voltage drop means comprises a plurality of PMOS transistors coupled in serial between the third and the fourth operating voltages, wherein one of the plurality of PMOS transistors receives an output signal of the second control device through its control electrode and each remaining one of the plurality of PMOS transistors operating as an active load with its control electrode coupled to its first electrode.

16. The power reduction circuit of claim 12, wherein the fourth operating voltage is equal to the third operating voltage reduced by a threshold voltage of the second voltage drop device when the second voltage drop device is activated.

17. The power reduction circuit of claim 5, wherein the second control device comprises:
   an NMOS transistor that outputs the fourth operating voltage to activate the second voltage drop device when enabled, wherein the NMOS transistor is enabled by the first operating mode control signal; and a PMOS transistor that outputs the third operating voltage to deactivate the second voltage drop device when enabled, wherein the PMOS transistor is enabled by the second operating mode control signal, wherein the second operating mode control signal is an inverse of the first operating mode control signal.

* * * * *